INTEGRATED FIELD EFFECT CIRCUITRY

Filed March 5, 1964

Inventor
Jack Blanluet
By Cushman, Darby & Cushman
Attorneys

3,379,941
INTEGRATED FIELD EFFECT CIRCUITRY

Jack Blanluet, Paris, France, assignor to CSF—Compagnie Generale de Telegraphie Sans Fil, a corporation of France Filed Mar. 5, 1964, Ser. No. 349,710
Claims priority, application France, Mar. 6, 1963, 926,978
2 Claims. (Cl. 317—235)

ABSTRACT OF THE DISCLOSURE

An integrated circuit comprises a substrate and over said substrate, a plurality of electric components, each connecting one point of the circuit to another. Each component is enclosed in the channel of a field effect structure comprising a source, a drain and two gates. The channel is pinched off by applying to the gates, source and drain, a convenient D.C. potential, and insulates this component from the other parts of the circuit.

The present invention relates to integrated circuits.

As is well known, integrated circuits are built up by forming within the body of a semiconductor plate, pellet or wafer, for example a silicon plate or pellet, a number of layers having different conduction characteristics which constitute the various components of the integrated circuit, such as transistors, resistances and others.

Under certain conditions, the problem may arise of defining the boundaries of a component on the surface of a semiconductor body, in other words of defining with great precisions the geometry of the component or components concerned.

To this end, it is known, to define the geometry of one component by diffusing into a semiconductor plate an impurity, whose conductivity type is the reverse of that of the remainder of the substrate.

However, it may be of interest to isolate within an integrated structure, elements having the same type of conductivity without any diffusion other than that which serves to form the other components of the integrated circuit.

It is an object of the invention to provide an improved integrated circuit wherein this problem is solved.

According to the invention there is built within the semi-conductor body within which the integrated circuit is formed, at least one field effect structure which, upon application to it of a blocking bias, is capable of forming within said body an insulating region of a predetermined geometry.

In particular, resistors can be formed in this way in an integrated circuit.

The invention will be best understood from the following description and accompanying drawing, wherein.

The same reference numbers are used to designate the same parts in the different figures.

Figure 1:
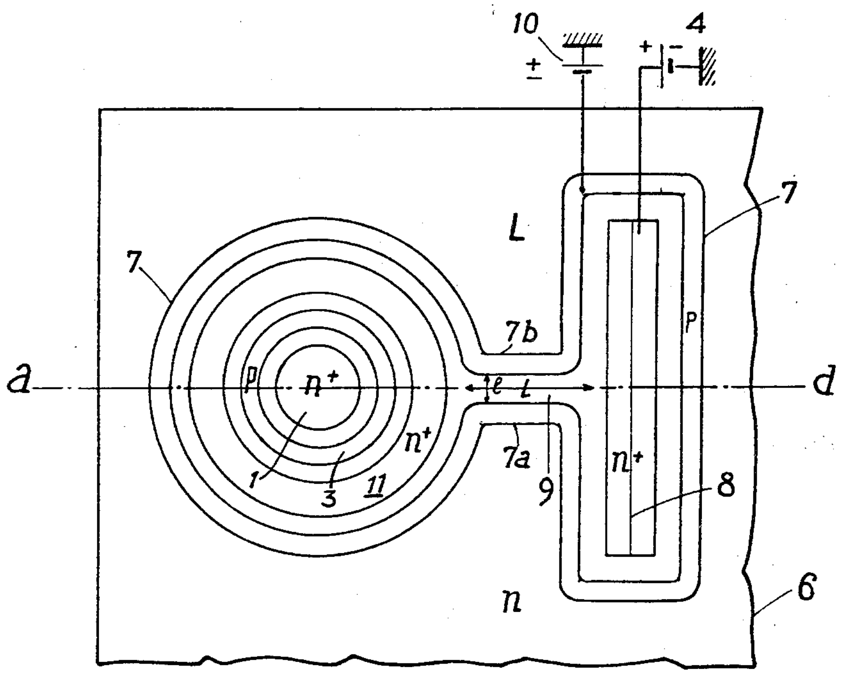
FIG. 1 is a top view of a portion of an integrated circuit according to the invention.
Figure 2:
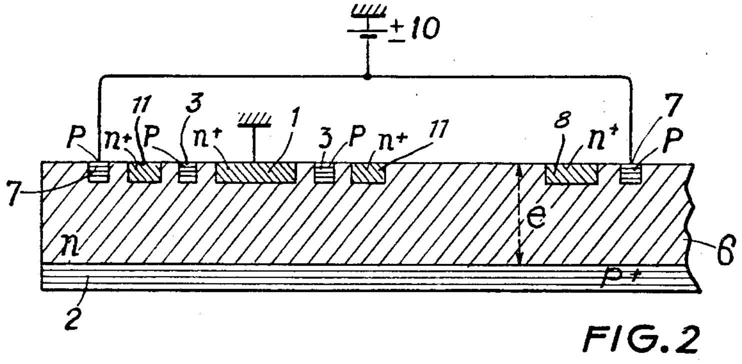
FIG. 2 is a section through line *a–d* of FIG. 1, in which the thickness of the structure has been considerably enlarged for clarity.
Figure 3:
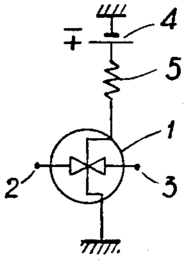
FIG. 3 is the equivalent circuit of the arrangement shown in FIGS. 1 and 2.

FIG. 3 shows the diagram of the circuit which it is desired to form, i.e. a field effect structure, whose respective gates are connected to terminals 2 and 3, whose source is grounded, and whose drain is coupled to a D.C. supply 4 through a load resistor 5.

Said field effect component is formed in a conventional manner, i.e. by means of a comparatively shallow diffusion within one face of a plate 6 of n type silicon from an epitaxial wafer.

This gives, on one face, a circular source 1 of $n^+$ type, a circular gate 3 of p type and a circular drain 11 of $n^+$ type and, on the other face, a $p^+$ type layer which is gate 2.

According to the invention, a resistance 5 is obtained by determining a region of n type having a well defined geometry within the silicon body, by forming a field effect structure in the following manner.

A strip 8 of $n^+$ type, and a strip 7 of p type are formed. Strip 7 surrounds the annular junction $n^+$, that makes up the drain of the field effect component 1, and strip 8 an defines a channel 9, of length L and a width *l*.

Region 8 serves as the drain of the above field effect structure, the region 11 playing the role of source, while regions 7 and 2 are the gates. In order for the set up to operate according to the invention it suffices that the field effect structure should be blocked. In other words, the potential applied to strip 7 must be negative with respect to region 6 potential; potential of region 8 being of course positive with respect to region 6 potential.

Under such conditions, the two semiconductor regions of *n* type located below portions 7*a* and 7*b*, operate as insulators. A region 9 of n type having a length L, a width *l*, and whose depth *e* equals that of layer *n*, is thus defined.

This region builds up a well defined resistor which is the resistor 5 of FIG. 3. It connects the drain of the field effect transistor 1 to strip 8 biased by the D.C. supply 4.

Of course, the invention is not limited to the embodiment described and shown which was given solely by way of example.

Various integrated circuits may be devised including a field effect structure according to the invention, and the field effect structure playing the role of insulator may be formed in various manners known to those skilled in the art.

The field effect structure must be so formed that the leakage current in the blocked channel should be as low as possible.

The region which is relatively of the p type serving as gate for the field effect structure can also serve in addition as a resistive element in the integrated circuit.

What is claimed is:

1. In an integrated circuit,
- a semiconductor wafer of one conductivity type,
- a first source region of said one conductivity type disposed in said wafer,
- a first drain region of said one conductivity type disposed in said wafer adjacent said source region,
- a first gate region of opposite conductivity type disposed in said wafer between said source and drain regions,
- a second drain region of said one conductivity type disposed in said wafer at a given space from said first drain,
- a second gate region of said opposite conductivity type disposed in said wafer in the form of a constricted loop so as to encompass all of the aforesaid regions with a constriction of said space to form in said wafer a channel region of said one conductivity type and having a significant characteristic of an electrical element, and
- bias means connected to said source, and second gate region for completely pinching off said channel region to isolate said electrical element from said wafer.

2. An integrated circuit as claimed in claim 1, wherein said channel region has the characteristic of a resistor.

(References on following page)

References Cited

UNITED STATES PATENTS

| | | | |
|---|---|---|---|
| 2,985,804 | 5/1961 | Buie | 317—235 |
| 3,035,186 | 5/1962 | Doucette | 307—88.5 |
| 3,112,411 | 11/1963 | Cook et al. | 307—88.5 |
| 3,130,377 | 4/1964 | Brown et al. | 307—88.5 XR |
| 3,134,912 | 5/1964 | Evans | 307—88.5 |
| 3,150,299 | 9/1964 | Noyce | 317—235 |
| 3,171,042 | 2/1965 | Matare | 307—88.5 |
| 3,208,002 | 9/1965 | MacDonald | 330—38 |
| 3,230,398 | 1/1966 | Evans et al. | 307—88.5 |
| 3,237,018 | 2/1966 | Leger | 307—88.5 |
| 3,242,394 | 3/1966 | Biard | 317—235 |
| 3,284,723 | 11/1966 | Henkels | 331—107 |

JOHN W. HUCKERT, *Primary Examiner.*

R. F. SANDLER, *Assistant Examiner.*